US012279536B2

United States Patent
Chiou et al.

(10) Patent No.: US 12,279,536 B2
(45) Date of Patent: *Apr. 15, 2025

(54) SEMICONDUCTOR DEVICE AND METHOD FOR FABRICATING THE SAME

(71) Applicant: UNITED MICROELECTRONICS CORP., Hsin-Chu (TW)

(72) Inventors: Jin-Yan Chiou, Tainan (TW); Wei-Chuan Tsai, Changhua County (TW); Hsin-Fu Huang, Tainan (TW); Yen-Tsai Yi, Tainan (TW); Hsiang-Wen Ke, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/610,212

(22) Filed: Mar. 19, 2024

(65) Prior Publication Data

US 2024/0237549 A1 Jul. 11, 2024

Related U.S. Application Data

(63) Continuation of application No. 16/882,552, filed on May 25, 2020, now Pat. No. 11,968,906.

(30) Foreign Application Priority Data

Apr. 29, 2020 (CN) .......................... 202010354013.4

(51) Int. Cl.
| | | |
|---|---|---|
| *H10N 50/80* | (2023.01) | |
| *G11C 11/16* | (2006.01) | |
| *H10N 50/01* | (2023.01) | |
| *H10N 50/85* | (2023.01) | |
| *H01F 10/32* | (2006.01) | |
| *H01F 41/32* | (2006.01) | |

(52) U.S. Cl.
CPC ........... *H10N 50/80* (2023.02); *G11C 11/161* (2013.01); *H10N 50/01* (2023.02); *H10N 50/85* (2023.02); *H01F 10/3254* (2013.01); *H01F 41/32* (2013.01)

(58) Field of Classification Search
None
See application file for complete search history.

(56) References Cited

U.S. PATENT DOCUMENTS

| | | |
|---|---|---|
| 8,962,349 B1 | 2/2015 | Chen |
| 9,818,935 B2 | 11/2017 | Chuang et al. |
| 10,534,276 B1 | 1/2020 | Yang et al. |
| 10,535,817 B1 | 1/2020 | Hung |
| 11,968,906 B2* | 4/2024 | Chiou .................... H10N 50/85 |

(Continued)

FOREIGN PATENT DOCUMENTS

| | | |
|---|---|---|
| CN | 109994500 A | 7/2019 |
| CN | 110890460 A | 3/2020 |

*Primary Examiner* — Xiaoming Liu
(74) *Attorney, Agent, or Firm* — Winston Hsu

(57) ABSTRACT

A method for fabricating a semiconductor device includes the steps of: forming a first inter-metal dielectric (IMD) layer on a substrate; forming a contact hole in the first IMD layer; forming a bottom electrode layer in the contact hole; forming a magnetic tunneling junction (MTJ) stack on the bottom electrode layer; and removing the MTJ stack and the bottom electrode layer to form a MTJ on a bottom electrode. Preferably, the bottom electrode protrudes above a top surface of the first IMD layer.

6 Claims, 3 Drawing Sheets

(56) References Cited

U.S. PATENT DOCUMENTS

| | | |
|---|---|---|
| 2016/0190207 A1 | 6/2016 | Nam |
| 2017/0358734 A1 | 12/2017 | Zheng |
| 2020/0083428 A1 | 3/2020 | Weng |
| 2021/0043827 A1 | 2/2021 | Hashemi |

* cited by examiner

SEMICONDUCTOR DEVICE AND METHOD FOR FABRICATING THE SAME

CROSS REFERENCE TO RELATED APPLICATIONS

This application is a continuation application of U.S. application Ser. No. 16/882,552, filed on May 25, 2020. The content of the application is incorporated herein by reference.

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating a semiconductor device includes the steps of: forming a first inter-metal dielectric (IMD) layer on a substrate; forming a contact hole in the first IMD layer; forming a bottom electrode layer in the contact hole; forming a magnetic tunneling junction (MTJ) stack on the bottom electrode layer; and removing the MTJ stack and the bottom electrode layer to form a MTJ on a bottom electrode. Preferably, the bottom electrode protrudes above a top surface of the first IMD layer.

According to another aspect of the present invention, a semiconductor device includes: a first inter-metal dielectric (IMD) layer on a substrate; a bottom electrode in the first IMD layer and protruding above a top surface of the first IMD layer; a magnetic tunneling junction (MTJ) on the bottom electrode; and a top electrode on the MTJ.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
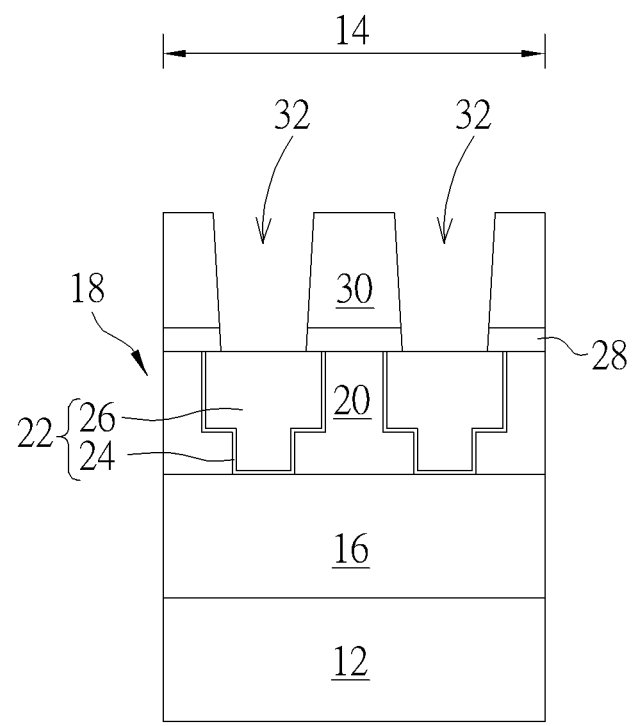
FIGS. 1-6 illustrate a method for fabricating a semiconductor device according to an embodiment of the present invention.

Referring to FIGS. 1-6, FIGS. 1-6 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 14 and a logic region (not shown) are defined on the substrate 12.

Active devices such as metal-oxide semiconductor (MOS) transistors, passive devices, conductive layers, and interlayer dielectric (ILD) layer 16 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 16 could be formed on the substrate 12 to cover the MOS transistors, and a plurality of contact plugs could be formed in the ILD layer 16 to electrically connect to the gate structure and/or source/drain region of MOS transistors. Since the fabrication of planar or non-planar transistors and ILD layer is well known to those skilled in the art, the details of which are not explained herein for the sake of brevity.

Next, a metal interconnect structure 18 is formed on the ILD layer 16 to electrically connect the aforementioned contact plugs, in which the metal interconnect structure 18 includes an inter-metal dielectric (IMD) layer 20 and metal interconnections 22 embedded in the IMD layer 20. In this embodiment, each of the metal interconnections 24 from the metal interconnect structure 18 could include a trench conductor or a via conductor, in which the metal interconnections 22 could be embedded within the IMD layers 20 and electrically connected to each other according to a single damascene process or dual damascene process. For instance, each of the metal interconnections 22 could further include a barrier layer 24 and a metal layer 26, in which the barrier layer 24 could be selected from the group consisting of titanium (Ti), titanium nitride (TiN), tantalum (Ta), and tantalum nitride (TaN) and the metal layer 26 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layer 26 is preferably made of copper and the IMD layer 20 is preferably made of silicon oxide.

Figure 2:
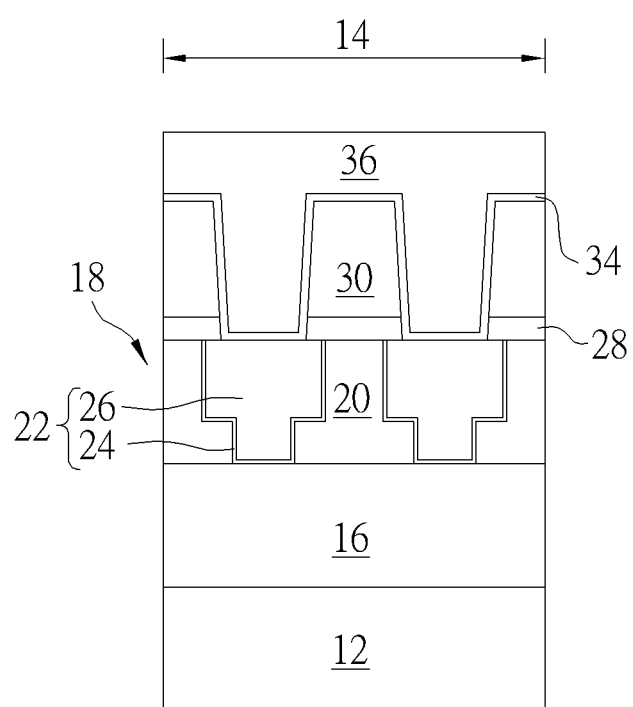

Next, a stop layer 28 and an IMD layer 30 are formed on the metal interconnect structure 18, a photo-etching process is conducted to remove part of the IMD layer 30 and part of the stop layer 28 to form contact holes 32 exposing the top surface of the metal interconnection 22. In this embodiment, the stop layers 28 is preferably made of nitrogen doped carbide (NDC), silicon nitride, silicon carbon nitride (SiCN), or combination thereof and the IMD layer 30 preferably includes an ultra low-k (ULK) dielectric layer including but not limited to for example porous material or silicon oxycarbide (SiOC), Next, as shown in FIG. 2, a liner 34 and a bottom electrode layer 36 are formed to fill the contact holes 32 completely. Preferably, the liner 34 and the bottom electrode layer 36 are made of different materials, in which the liner 34 preferably includes titanium (Ti) while the bottom electrode layer 36 includes titanium nitride (TiN).

Figure 3:
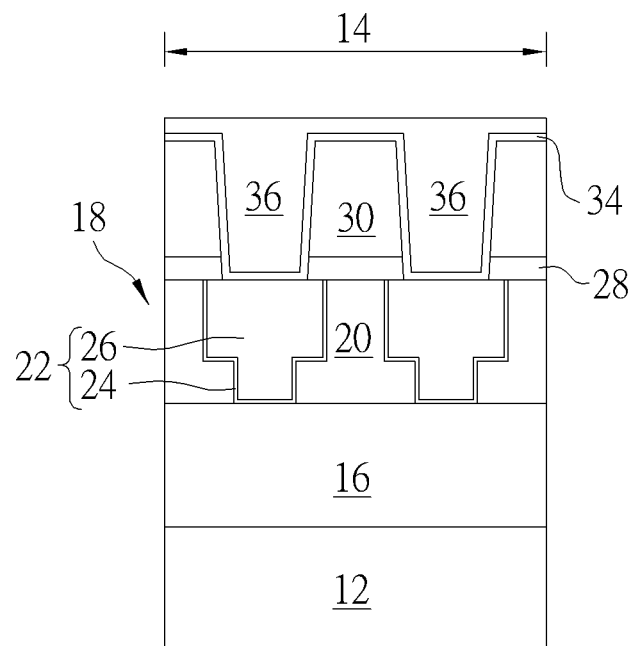

Next, as shown in FIG. 3, a planarizing process such as chemical mechanical polishing (CMP) process is conducted to remove part of the bottom electrode layer 36 while the top surface of the remaining bottom electrode layer 36 is still higher than the top surface of the IMD layer 30.

Figure 4:
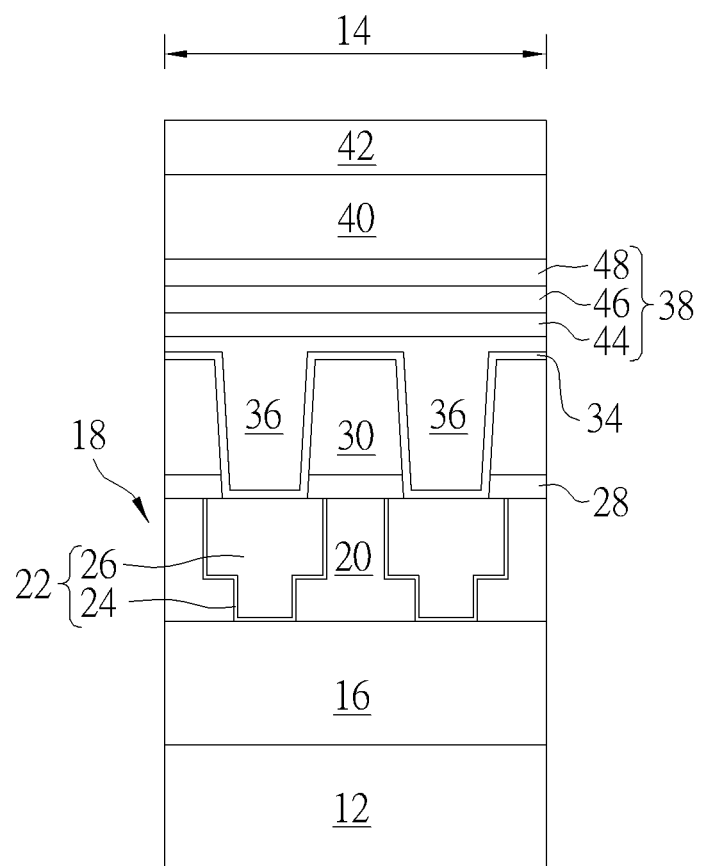

Next, as shown in FIG. 4, a MTJ stack 38, a top electrode layer 40, and a hard mask 42 are formed on the bottom electrode layer 36. In this embodiment, the formation of the MTJ stack 38 could be accomplished by sequentially depositing a pinned layer 44, a barrier layer 46, and a free layer 48. In this embodiment, the pinned layer 44 could be made of antiferromagnetic (AFM) material including but not limited to for example ferromanganese (FeMn), platinum manganese (PtMn), iridium manganese (IrMn), nickel oxide (NiO), or combination thereof, in which the pinned layer 44 is formed to fix or limit the direction of magnetic moment of adjacent layers. The barrier layer 46 could be made of insulating material including but not limited to for example oxides such as aluminum oxide ($AlO_x$) or magnesium oxide (MgO). The free layer 48 could be made of ferromagnetic material including but not limited to for example iron, cobalt, nickel, or alloys thereof such as cobalt-iron-boron (CoFeB), in which the magnetized direction of the free layer 48 could be altered freely depending on the influence of outside magnetic field. The top electrode layer 40 is preferably made of conductive material including but not limited to for example Ta, Pt, Cu, Au, Al, or combination thereof and the hard mask 42 is preferably made silicon oxide.

Figure 5:
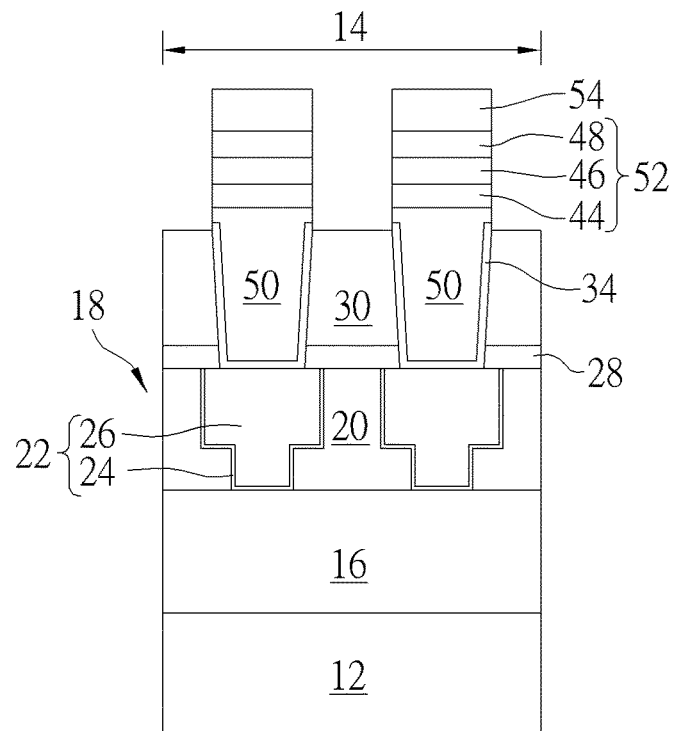

Next, as shown in FIG. 5, one or more etching process is conducted by using a patterned mask (not shown) such as a patterned resist as mask to remove part of the hard mask 42, part of the top electrode layer 40, part of the MTJ stack 38, and part of the bottom electrode layer 36 to form bottom electrodes 50, MTJs 52 on the bottom electrodes 50, and top electrodes 54 on the MTJs 52. It should be noted that a reactive ion etching (RIE) process and/or an ion beam etching (IBE) process could be conducted to pattern the MTJ stack 38 and due to the characteristics of the IBE process, the top surface of the remaining IMD layer 30 could be slightly lower than the top surface of the metal interconnections 32 after the IBE process and the top surface of the IMD layer 30 also reveals a curve or an arc (not shown in FIG. 5).

Figure 6:
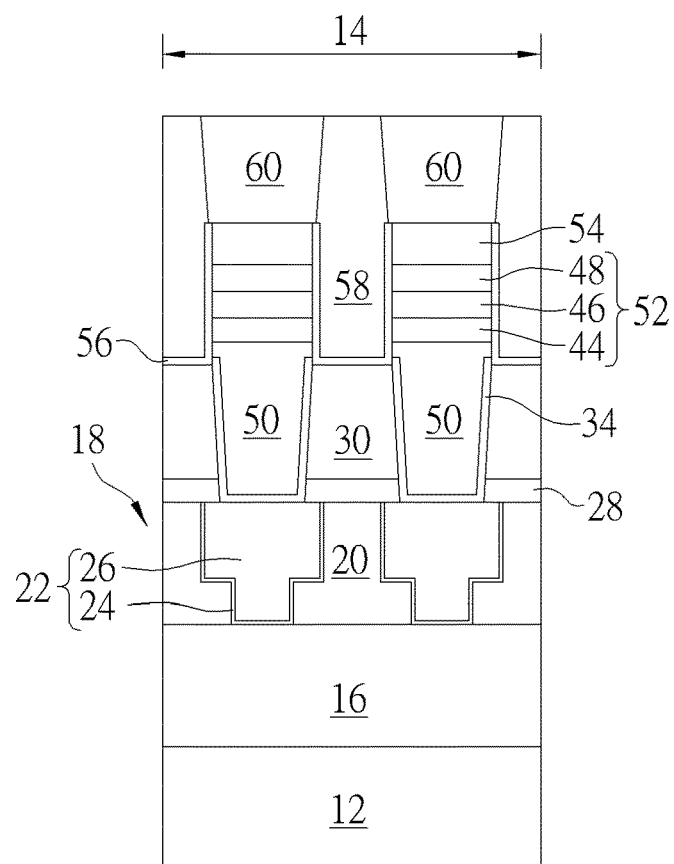

Next, as shown in FIG. 6, a cap layer 56 is formed on the MTJs 52 and covering the surface of the IMD layer 30, an IMD layer 58 is formed on the cap layer 56, and one or more photo-etching process is conducted to remove part of the IMD layer 58 and part of the cap layer 56 to form contact holes (not shown) exposing the top electrodes 54. Next, conductive materials are deposited into the contact holes and planarizing process such as CMP is conducted to form metal interconnections 60 connecting the top electrodes 54 underneath.

In this embodiment, the cap layer 56 preferably includes silicon nitride, but could also include other dielectric material including but not limited to for example silicon oxide, silicon oxynitride (SiON), or SiCN depending on the demand of the product. Similar to the aforementioned metal interconnections, the metal interconnections 60 could be formed in the IMD layer 58 according to a single damascene process or dual damascene process. For instance, each of the metal interconnection 60 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). This completes the fabrication of a semiconductor device according to an embodiment of the present invention.

Referring again to FIG. 6, FIG. 6 further illustrates a structural view of a semiconductor device according to an embodiment of the present invention. As shown in FIG. 6, the semiconductor device includes an IMD layer 20 disposed on the substrate 12, metal interconnections 22 disposed in the IMD layer 20, an IMD layer 30 disposed on the IMD layer 20, bottom electrodes 50 disposed in the IMD layer 30 and protruding above a top surface of the IMD layer 30, MTJs 52 disposed on the bottom electrodes 50, top electrodes 54 disposed on the MTJs 52, and a liner 34 disposed between the bottom electrodes 50 and the metal interconnection 22.

In this embodiment, the liner 34 and the bottom electrodes 50 are preferably made of different materials, in which the liner 34 preferably includes metal such as titanium (Ti) while the bottom electrodes 50 preferably include metal nitride such as titanium nitride (TiN). Preferably, the top surface of the liner 34 is slightly higher than or even with the top surface of the surrounding IMD layer 30 and lower than the top surface of the bottom electrode 50 and the liner 34 includes a substantially U-shape cross-section.

Typically, the metal interconnection disposed directly under the MTJ for connecting the bottom electrode and copper metal interconnection (such as the metal interconnection 22) is preferably made of tungsten (W) and the IBE process conducted to pattern the MTJ stack often damages the metal interconnection made of tungsten and causes the tungsten to splatter onto the sidewalls of the MTJ to result in short circuit. To resolve this issue the present invention preferably replaces the metal interconnection made of tungsten with TiN and combines the bottom electrode directly under the MTJ with the metal interconnection underneath to form an integrated structure so that short circuit caused by splatter of tungsten metal during the patterning of MTJ stack could be minimized.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a first inter-metal dielectric (IMD) layer on a substrate;
   a bottom electrode in the first IMD layer and protruding above a top surface of the first IMD layer;

a liner directly contacting sidewalls and a bottom surface of the bottom electrode, wherein a bottom surface width in a cross section view of the liner is less than a top surface width in a cross section view of the bottom electrode, the liner comprises a U-shape having a first vertical portion, a second vertical portion, and a horizontal portion connecting the first vertical portion and the second vertical portion, the first vertical portion and the second vertical portion are not extended to directly contact a top surface of the first IMD layer, and the liner and the bottom electrode comprise different materials;

a magnetic tunneling junction (MTJ) on the bottom electrode, wherein a bottom surface width in the cross section view of the bottom electrode is less than a bottom surface width in a cross section view of the MTJ, sidewalls of the MTJ are aligned with sidewalls of the first vertical portion and the second vertical portion, and the MTJ comprises:

a pinned layer on and directly contacting the bottom electrode;

a barrier layer on the pinned layer;

a free layer on the barrier layer; and a top electrode on the MTJ.

2. The semiconductor device of claim 1, further comprising:

a second IMD layer on the substrate;

a metal interconnection in the second IMD layer;

the first IMD layer on the second IMD layer; and the bottom electrode on the metal interconnection.

3. The semiconductor device of claim 2, further comprising the liner between the bottom electrode and the metal interconnection.

4. The semiconductor device of claim 1, wherein the liner comprises titanium (Ti).

5. The semiconductor device of claim 1, wherein the bottom electrode comprises titanium nitride (TiN).

6. The semiconductor device of claim 1, wherein the bottom electrode is a single piece.

* * * * *